United States Patent
Hummert et al.

(10) Patent No.: US 11,696,493 B2
(45) Date of Patent: *Jul. 4, 2023

(54) ORGANIC ELECTRONIC DEVICE COMPRISING AN INVERSE COORDINATION COMPLEX AND A METHOD FOR PREPARING THE SAME

(71) Applicant: Novaled GmbH, Dresden (DE)

(72) Inventors: Markus Hummert, Dresden (DE); Thomas Rosenow, Dresden (DE); Tomas Kalisz, Dresden (DE)

(73) Assignee: Novaled GmbH, Dresden (DE)

( * ) Notice: Subject to any disclaimer, the term of this patent is extended or adjusted under 35 U.S.C. 154(b) by 313 days.

This patent is subject to a terminal disclaimer.

(21) Appl. No.: 16/955,830

(22) PCT Filed: Dec. 20, 2018

(86) PCT No.: PCT/EP2018/086108
§ 371 (c)(1),
(2) Date: Jun. 19, 2020

(87) PCT Pub. No.: WO2019/122081
PCT Pub. Date: Jun. 27, 2019

(65) Prior Publication Data
US 2020/0343461 A1    Oct. 29, 2020

(30) Foreign Application Priority Data

Dec. 20, 2017 (EP) .................................. 17209037

(51) Int. Cl.
*H10K 85/30* (2023.01)
*H10K 50/155* (2023.01)
(Continued)

(52) U.S. Cl.
CPC ............. *H10K 85/381* (2023.02); *C07F 3/06* (2013.01); *H10K 50/155* (2023.02); *H10K 50/15* (2023.02)

(58) Field of Classification Search
None
See application file for complete search history.

(56) References Cited

U.S. PATENT DOCUMENTS 6,528,187 B1    3/2003 Okada
8,329,898 B2   12/2012 Salbeck et al.
(Continued)

FOREIGN PATENT DOCUMENTS

JP    2000144125 A    5/2000
JP    2010513451 A    4/2010
(Continued)

OTHER PUBLICATIONS

English translation of the Japanese search report for JP App. No. 2020-534438 (corresponds to this examined U.S. Appl. No. 16/955,830), report dated Aug. 10, 2022, accessed online from Espacenet's Global Dossier; PDF copy, pp. 1-11, is attached. (Year: 2022).*

(Continued)

*Primary Examiner* — Katie L. Hammer
(74) *Attorney, Agent, or Firm* — Eversheds Sutherland (US) LLP

(57) ABSTRACT

The present invention relates to an organic electronic device comprising at least one inverse coordination complex, the N inverse coordination complex comprising: (i) a core consisting of one atom or of a plurality of atoms forming together a covalent cluster; (ii) a first coordination sphere consisting of at least four electropositive atoms having each individually an electronegativity according to Allen of less than 2,4; and (iii) a second coordination sphere comprising a plurality of ligands; wherein the first coordination sphere (Continued)

Compound E3 is closer to the core than the second coordination sphere; and all atoms of the core have a higher electronegativity according to Allen than any of the electropositive atoms of the first coordination sphere and a method for preparing the same.

13 Claims, 3 Drawing Sheets

(51) Int. Cl.
    *C07F 3/06*     (2006.01)
    *H10K 50/15*     (2023.01)

(56) References Cited

U.S. PATENT DOCUMENTS

| | | | |
|---|---|---|---|
| 9,217,104 B2 | 12/2015 | Lewinski et al. | |
| 9,722,183 B2 | 8/2017 | Fadhel et al. | |
| 2004/0023061 A1* | 2/2004 | Kathirgamanathan | H01L 51/0035 313/506 |
| 2009/0048415 A1* | 2/2009 | Buesing | H01L 51/0085 546/10 |
| 2009/0179553 A1 | 7/2009 | Yakuschenko et al. | |
| 2009/0212280 A1* | 8/2009 | Werner | H01L 51/008 438/510 |
| 2010/0060152 A1 | 3/2010 | Kathirgamanathan et al. | |
| 2016/0105353 A1 | 4/2016 | Cociglio | |
| 2016/0160348 A1 | 6/2016 | Siu et al. | |

FOREIGN PATENT DOCUMENTS

| | | |
|---|---|---|
| JP | 2016525815 A | 8/2016 |
| WO | 2016195080 A1 | 12/2016 |

OTHER PUBLICATIONS

Allen, Leland C. "Electronegativity is the Average One-Electron Energy of the Valence-Shell Electrons in Ground-State Free Atoms" J. Am. Chem. Soc. 1989, 111, 9003-9014. (Year: 1989).*

Ma et al. "A blue electroluminescent molecular device from a tetranuclear zinc(II) compound," Chem. Commun., 1998, 2491-2492. (Year: 1998).*

Haiduc, Ionel, Inverse coordination—An emerging new chemical concept. Oxygen and other chalcogens as coordination centers, Coordination Chemistry Reviews 338 (2107) 1-26.

Haiduc, Ionel, Inverse coordination—An emerging new chemical concept. II. Halogens as coordination centers, Coordination Chemistry Reviews 348 (2017) 71-91.

PCT International Search Report and Written Opinion for PCT Application No. PCT/EP2018/086108 dated Mar. 6, 2019 (9 pages).

Shirota et al., "Charge Carrier Transporting Molecular Materials and Their Applications in Devices," Chem. Rev., 2007, 107:953-1010.

Office Action dated Jun. 28, 2022 in Taiwanese Patent Application No. 107146187 (English translation).

Notice of Reasons for Refusal issued in Japan application No. 2020-534438, dated Aug. 30, 2022, 16 pp.

Y. Ma et al., A blue electroluminescent molecular device from a tetranucluear zinc(II) compound [Zn4O(AID)6] (AID=7-azaindolate), Chem. Commun., Britain, Royal Society of Chemistry, Dec. 31, 1998, pp. 2491-2492.

* cited by examiner

ORGANIC ELECTRONIC DEVICE COMPRISING AN INVERSE COORDINATION COMPLEX AND A METHOD FOR PREPARING THE SAME

CROSS REFERENCE TO RELATED APPLICATIONS

This application is a U.S. national stage application of PCT/EP2018/086108, filed Dec. 20, 2018, which claims priority to European Application No. 17209037.5, filed Dec. 20, 2017. The content of these applications is incorporated herein by reference.

The present invention relates to an organic electronic device comprising an inverse coordination complex and a method for preparing the same.

BACKGROUND ART

Organic light-emitting diodes (OLEDs), which are self-emitting devices, have a wide viewing angle, excellent contrast, quick response, high brightness, excellent driving voltage characteristics, and color reproduction. A typical OLED includes an anode, a hole transport layer (HTL), an emission layer (EML), an electron transport layer (ETL), and a cathode, which are sequentially stacked on a substrate. In this regard, the HTL, the EML, and the ETL are thin films formed from organic and/or organometallic compounds.

When a voltage is applied to the anode and the cathode, holes injected from the anode electrode move to the EML, via the HTL, and electrons injected from the cathode electrode move to the EML, via the ETL. The holes and electrons recombine in the EML to generate excitons. When the excitons drop from an excited state to a ground state, light is emitted. The injection and flow of holes and electrons should be balanced, so that an OLED having the above-described structure has excellent efficiency.

WO 2012/005615 discloses zinc complexes with photoluminescent properties wherein in the complexes a central oxide dianion is tetrahedrally coordinated with four Zn cations.

However, there is still a need to improve the performance of electronic devices, in particular to select suitable materials to be comprised in organic charge transport layers, organic charge injection layers or charge generating layers thereof.

It is, therefore, the object of the present invention to provide an electronic device and a method for preparing the same overcoming drawbacks of the prior art, in particular to provide electronic devices comprising novel organic charge transport materials, an organic charge injection materials or a charge generating materials, for improving the performance of the device, in particular for reducing operational voltage and/or improving efficiency, in particular in OLEDs.

SUMMARY OF THE INVENTION

The above object is achieved by an organic electronic device comprising at least one inverse coordination complex, the inverse coordination complex comprising: (i) a core consisting of one atom or of a plurality of atoms forming together a covalent cluster; (ii) a first coordination sphere consisting of at least four electropositive atoms having each individually an electronegativity according to Allen of less than 2.4; and (iii) a second coordination sphere comprising a plurality of ligands; wherein the first coordination sphere is closer to the core than the second coordination sphere; all atoms of the core have a higher electronegativity according to Allen than any of the electropositive atoms of the first coordination sphere; and at least one ligand of the second coordination sphere is covalently bound to at least two atoms of the first coordination sphere.

With regard to interatomic interaction which is typically mirrored by equilibrium distance between the interacting atoms, the relationship between the core and the first coordination sphere in inverse coordination complexes is the same as in normal coordination complexes. In other words, in couples of closest atoms of the entire complex, wherein the first atom of the couple belongs to the core and the second atom of the couple belongs to the first coordination sphere, the distance between the first and the second atom is equal to or shorter than the sum of van der Waals radii of the first and of the second atom. The term "inverse" encompasses the circumstance that whereas in normal complexes an electropositive central atom is surrounded by more electronegative atoms of respective ligands, in inverse coordination complexes, the electronegative atoms of the core are surrounded by more electropositive atoms of the first coordination sphere.

It was surprisingly found by the inventors that an electronic device comprising the inverse coordination complex as defined above in a charge injection layer, a charge transport layer or a charge generating layer thereof shows superior properties over devices of the prior art, in particular with respect to operational voltage and quantum efficiency. Particular advantages were achieved when the charge is a positive charge, i.e. the charge injection/transport/generating layer is a hole injection/transport/generating layer. Further advantages are apparent from the specific examples presented herein.

In the organic electronic device, the inverse coordination complex may be electrically neutral. In this way, fine tuning of the electronic structure of the inventive inverse coordination complex is achieved to improve the usability thereof in charge injection layers, charge transport layers or charge generating layers of electronic devices, in particular in hole injection layer, hole transport layers and hole generating layers.

In the organic electronic device, the electropositive atoms of the first coordination sphere may be independently selected from atoms having electronegativity according to Allen of less than 2.3, alternatively less than 2.2, alternatively less than 2.1, alternatively less than 2.0, alternatively less than 1.9. In this way, fine tuning of the electronic structure of the inventive inverse coordination complex is achieved to improve the usability thereof in charge injection layers, charge transport layers or charge generating layers of electronic devices, in particular in hole injection layer, hole transport layers and hole generating layers.

In the organic electronic device, the electropositive atoms may be independently selected from metal ions in the oxidation state (II), alternatively from transition metals of the fourth period of the Periodic Table of Elements in the oxidation state (II), alternatively from Ti, Cr, Mn, Fe, Co, Ni, Zn, and Cu in the oxidation state (II); alternatively from Mn(II), Fe(II), Co(II), Ni(II) and Zn(II); alternatively the electropositive atoms are each Zn(II). In this way, fine tuning of the electronic structure of the inventive inverse coordination complex is achieved to improve the usability thereof in charge injection layers, charge transport layers or charge generating layers of electronic devices, in particular in hole injection layer, hole transport layers and hole generating layers.

In the organic electronic device, the atoms of the core may have electronegativity according to Allen of more than 1.7, alternatively more than 1.8, alternatively more than 1.9, alternatively more than 2.0, alternatively more than 2.1, alternatively more than 2.2, alternatively more than 2.3, alternatively more than 2.4. In this way, fine tuning of the electronic structure of the inventive inverse coordination complex is achieved to improve the usability thereof in charge injection layers, charge transport layers or charge generating layers of electronic devices, in particular in hole injection layer, hole transport layers and hole generating layers.

In the organic electronic device, the core may consist of one atom. In this way, fine tuning of the electronic structure of the inventive inverse coordination complex is achieved to improve the usability thereof in charge injection layers, charge transport layers or charge generating layers of electronic devices, in particular in hole injection layer, hole transport layers and hole generating layers.

In the organic electronic device, the core atom may be in a negative oxidation state. In this way, fine tuning of the electronic structure of the inventive inverse coordination complex is achieved to improve the usability thereof in charge injection layers, charge transport layers or charge generating layers of electronic devices, in particular in hole injection layer, hole transport layers and hole generating layers.

In the organic electronic device, the atoms of the core may be selected from chalcogen atoms in the oxidation state (-II), alternatively the atoms of the core may be independently selected from O, S, Se and Te respectively in the oxidation state (-II), alternatively from O(II) and S(-II), alternatively are O(-II). In this way, fine tuning of the electronic structure of the inventive inverse coordination complex is achieved to improve the usability thereof in charge injection layers, charge transport layers or charge generating layers of electronic devices, in particular in hole injection layer, hole transport layers and hole generating layers.

In the organic electronic device, the core may consist of one atom which may be O in the oxidation state (-II). In this way, fine tuning of the electronic structure of the inventive inverse coordination complex is achieved to improve the usability thereof in charge injection layers, charge transport layers or charge generating layers of electronic devices, in particular in hole injection layer, hole transport layers and hole generating layers.

In the organic electronic device, the first coordination sphere may consist of four electropositive atoms which may have an electronegativity according to Allen of less than 2.4, respectively in the oxidation state (II), and the four electropositive atoms may be tetrahedrally coordinated to the core. In this way, fine tuning of the electronic structure of the inventive inverse coordination complex is achieved to improve the usability thereof in charge injection layers, charge transport layers or charge generating layers of electronic devices, in particular in hole injection layer, hole transport layers and hole generating layers.

In the organic electronic device, the at least one ligand of the second coordination sphere, which bridges two electropositive atoms of the first coordination sphere, may be a bidentate anionic ligand formed by deprotonation of an alpha-gamma tautomerizable protic acid. Examples of alpha-gamma tautomerizable protic acids are carboxylic acids or sulfonamides comprising at least one proton bound to the nitrogen atom pf the amide group. Another example of an alpha-gamma tautomerizable protic acid is nitric acid.

In the organic electronic device, the ligands may be independently selected from carboxylate anions, nitrate anions and sulfonyl amide anions. In this way, fine tuning of the electronic structure of the inventive inverse coordination complex is achieved to improve the usability thereof in charge injection layers, charge transport layers or charge generating layers of electronic devices, in particular in hole injection layer, hole transport layers and hole generating layers.

In the organic electronic device, the ligands of the second coordination sphere may be represented by the general formula (I)

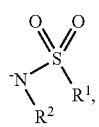

(I)

wherein $R^1$ and $R^2$ are independently selected from the groups, consisting of $C_1$ to $C_{30}$ hydrocarbyl groups and $C_2$ to $C_{30}$ heterocyclic group, wherein $R^1$ and/or $R^2$ may optionally be substituted with at least one of CN, F, Cl, Br and I. In this way, fine tuning of the electronic structure of the inventive inverse coordination complex is achieved to improve the usability thereof in charge injection layers, charge transport layers or charge generating layers of electronic devices, in particular in hole injection layer, hole transport layers and hole generating layers.

In the organic electronic device, the core may consist of one chalcogen atom selected from O, S, Se and Te in the oxidation state (-II); the first oxidation sphere may consists of four electropositive atoms which may be four metal atoms in the oxidation state (II) and which may be tetrahedrally coordinated to the core, and the second coordination sphere may consists of six ligands having the general formula (I). In this way, fine tuning of the electronic structure of the inventive inverse coordination complex is achieved to improve the usability thereof in charge injection layers, charge transport layers or charge generating layers of electronic devices, in particular in hole injection layer, hole transport layers and hole generating layers.

In the organic electronic device, each ligand of the second coordination sphere may be coordinated to two different metal atoms of the first coordination sphere. In this way, fine tuning of the electronic structure of the inventive inverse coordination complex is achieved to improve the usability thereof in charge injection layers, charge transport layers or charge generating layers of electronic devices, in particular in hole injection layer, hole transport layers and hole generating layers.

The organic electronic device may, between a first electrode and a second electrode, comprise an organic semiconducting layer comprising the at least one inverse coordination complex.

In the organic electronic device, the organic semiconducting layer may be a charge injection layer, a charge transport layer or a charge generation layer.

In the organic semiconducting device, the organic semiconducting layer may be a hole injection layer, a hole transport layer or a hole generation layer.

In the organic electronic device, the organic semiconducting layer may further comprise at least one organic matrix compound. The organic matrix compound may be a charge transport matrix and the inverse coordination complex may be an electrical dopant. The charge transport matrix may be a hole transport matrix.

The organic semiconducting device may further comprise at least one light emitting layer.

The organic electronic device may be an electroluminescent device. The electroluminescent device may be an organic light emitting diode.

Finally, the object is achieved by a method for preparing the inventive organic electronic device, the method comprising the steps of (a) evaporating the inverse coordination complex; and (b) depositing the inverse coordination complex on a solid support.

In the method, evaporation may be at elevated temperature and/or reduced pressure.

Furthermore, in the inventive method, the vaporizing and the depositing may respectively comprise co-vaporizing and co-depositing of the coordination complex with a matrix material.

Furthermore, the inventive method may comprise further process steps, in particular deposition of further layers suitable to be comprised in an organic electronic device.

With respect to the inverse coordination complexes comprised in the above organic semiconducting device, such inverse coordination complexes having a core consisting of a single O or F atom and in which the first coordination sphere comprises a H atom may be excluded.

Likewise, such inverse coordination complexes wherein the core consists of a single O or F atom and wherein the first coordination sphere consists of H atoms may be excluded.

In the following, the present invention will be explained referring to one specific embodiment.

DETAILED DESCRIPTION OF THE INVENTION

A zinc complex having composition $M^2L_2$ and supposed structure $E_2$, with an electron withdrawing ligand L with a perfluorphenyl group bound to a nitrogen, has been prepared. Further detailed studies on $E_2$, however, revealed that its sublimation is in fact accompanied by a chemical change, because the sublimed complex differs in its structure and composition from the starting material. More specifically, the sublimed material partly formed monocrystals of a size and quality suitable for X-ray diffraction (XRD), the structure and composition of this material, assigned herein as $E_3$, has been fully resolved by this method.

The XRD revealed that the sublimed material has an unexpected composition $Zn_4OL_6$ and a cluster structure $E_3$ shown in FIG. 4.

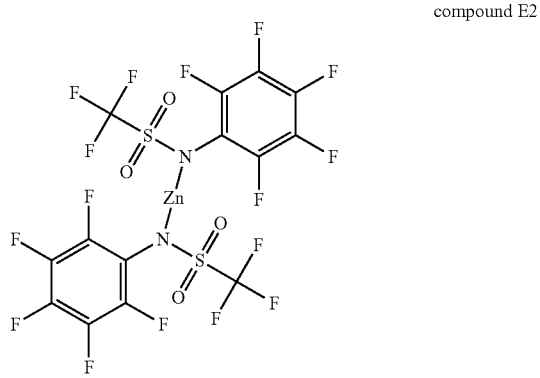

compound E2

Due to complexity of this molecule $E_3$ having summary formula $C_{42}F_{48}N_6O_{13}S_6Zn_4$, the structure shall be described in the next paragraph in form of a guide:

The molecule consists of the central oxide dianion, tetrahedrally coordinated with four Zn dications, bridged with six monoanionic ligands L (which are per se structurally identical as in formula $E_2$) in the way that on each edge of the central $Zn_4$ tetrahedron, one L is bound to both Zn cations through its N and O atoms, respectively, forming thus with both Zn cations and the central oxide dianion a six-membered —Zn—O—Zn—N—S—O— ring.

In the present application, the prior art compound B2

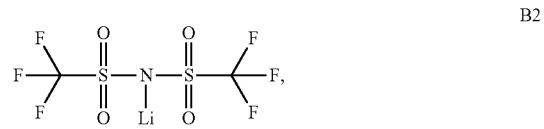

(LiTFSI), CAS 90076-65-6),
known for use in organic light emitting diodes of the prior art, in particular in hole injection materials thereof or as p-dopant, has been used as the reference material to show superiority of the inventive materials.

Further Layers

In accordance with the invention, the electronic device may comprise, besides the layers already mentioned above, further layers. Exemplary embodiments of respective layers are described in the following:

Substrate

The substrate may be any substrate that is commonly used in manufacturing of, electronic devices, such as organic light-emitting diodes. If light is to be emitted through the substrate, the substrate shall be a transparent or semitransparent material, for example a glass substrate or a transparent plastic substrate. If light is to be emitted through the top surface, the substrate may be both a transparent as well as a non-transparent material, for example a glass substrate, a plastic substrate, a metal substrate or a silicon substrate.

Anode Electrode

Either the first electrode or the second electrode may be an anode electrode. The anode electrode may be formed by depositing or sputtering a material that is used to form the anode electrode. The material used to form the anode electrode may be a high work-function material, so as to facilitate hole injection. The anode material may also be selected from a low work function material (i.e. aluminum). The anode electrode may be a transparent or reflective electrode. Transparent conductive oxides, such as indium tin oxide (ITO), indium zinc oxide (IZO), tin-dioxide (SnO2), aluminum zinc oxide (AlZO) and zinc oxide (ZnO), may be used to form the anode electrode. The anode electrode may also be formed using metals, typically silver (Ag), gold (Au), or metal alloys.

Hole Injection Layer

In accordance with the invention, the hole injection layer may comprise or consist of an inverse coordination complex as described above in very detail. The hole injection layer (HIL) may be formed on the anode electrode by vacuum deposition, spin coating, printing, casting, slot-die coating, Langmuir-Blodgett (LB) deposition, or the like. When the HIL is formed using vacuum deposition, the deposition conditions may vary according to the compound that is used to form the HIL, and the desired structure and thermal properties of the HIL. In general, however, conditions for vacuum deposition may include a deposition temperature of 100° C. to 500° C., a pressure of $10^{-8}$ to $10^{-3}$ Torr (1 Torr equals 133.322 Pa), and a deposition rate of 0.1 to 10 nm/sec.

When the HIL is formed using spin coating or printing, coating conditions may vary according to the compound that is used to form the HIL, and the desired structure and thermal properties of the HIL. For example, the coating conditions may include a coating speed of about 2000 rpm to about 5000 rpm, and a thermal treatment temperature of about 80° C. to about 200° C. Thermal treatment removes a solvent after the coating is performed.

The HIL may be formed—if the electronic device comprises besides the hole injection layer and/or a hole generating layer and the hole transport layer and/or the hole generating layer comprises the inverse coordination complex—of any compound that is commonly used to form a HIL. Examples of compounds that may be used to form the HIL include a phthalocyanine compound, such as copper phthalocyanine (CuPc), 4,4',4"-tris (3-methylphenylphenylamino) triphenylamine (m-MTDATA), TDATA, 2T-NATA, polyaniline/dodecylbenzenesulfonic acid (Pani/DBSA), poly(3,4-ethylenedioxythiophene)/poly(4-styrenesulfonate) (PEDOT/PSS). polyaniline/camphor sulfonic acid (Pani/CSA), and polyaniline)/poly(4-styrenesulfonate (PANI/PSS).

In such a case, the HIL may be a pure layer of p-dopant or may be selected from a hole-transporting matrix compound doped with a p-dopant. Typical examples of known redox doped hole transport materials are: copper phthalocyanine (CuPc), which HOMO level is approximately −5.2 eV, doped with tetrafluoro-tetracyanoquinonedimethane (F4TCNQ), which LUMO level is about −5.2 eV; zinc phthalocyanine (ZnPc) (HOMO=−5.2 eV) doped with F4TCNQ; α-NPD (N,N'-Bis(naphthalen-1-yl)-N,N'-bis (phenyl)-benzidine) doped with F4TCNQ. α-NPD doped with 2,2'-(perfluoronaphthalen-2,6-diylidene) dimalononitrile (PD1). α-NPD doped with 2,2',2"-(cyclopropane-1,2,3-triylidene)tris(2-(p-cyanotetrafluorophenyl)acetonitrile) (PD2). Dopant concentrations can be selected from 1 to 20 wt.-%, more preferably from 3 wt.-% to 10 wt.-%.

The thickness of the HIL may be in the range from about 1 nm to about 100 nm, and for example, from about 1 nm to about 25 nm. When the thickness of the HIL is within this range, the HIL may have excellent hole injecting characteristics, without a substantial penalty in driving voltage.

Hole Transport Layer

In accordance with the invention, the hole transport layer may comprise or consist of the inverse coordination complex as described above in detail.

The hole transport layer (HTL) may be formed on the HIL by vacuum deposition, spin coating, slot-die coating, printing, casting, Langmuir-Blodgett (LB) deposition, or the like. When the HTL is formed by vacuum deposition or spin coating, the conditions for deposition and coating may be similar to those for the formation of the HIL. However, the conditions for the vacuum or solution deposition may vary, according to the compound that is used to form the HTL.

In case that the HTL does not comprise an inverse coordination complex in accordance with the invention, but the inverse coordination complex is comprised in the HIL and/or the CGL, the HTL may be formed by any compound that is commonly used to form a HTL. Compounds that can be suitably used are disclosed for example in Yasuhiko Shirota and Hiroshi Kageyama, Chem. Rev. 2007, 107, 953-1010 and incorporated by reference. Examples of the compound that may be used to form the HTL are: carbazole derivatives, such as N-phenylcarbazole or polyvinylcarbazole; benzidine derivatives, such as N,N'-bis(3-methylphenyl)-N,N'-diphenyl-[1,1-biphenyl]-4,4'-diamine (TPD), or N,N'-di(naphthalen-1-yl)-N,N'-diphenyl benzidine (alpha-NPD); and triphenylamine-based compound, such as 4,4',4"-tris(N-carbazolyl)triphenylamine (TCTA). Among these compounds, TCTA can transport holes and inhibit excitons from being diffused into the EML.

The thickness of the HTL may be in the range of about 5 nm to about 250 nm, preferably, about 10 nm to about 200 nm, further about 20 nm to about 190 nm, further about 40 nm to about 180 nm, further about 60 nm to about 170 nm, further about 80 nm to about 160 nm, further about 100 nm to about 160 nm, further about 120 nm to about 140 nm. A preferred thickness of the HTL may be 170 nm to 200 nm.

When the thickness of the HTL is within this range, the HTL may have excellent hole transporting characteristics, without a substantial penalty in driving voltage.

Electron Blocking Layer

The function of the electron blocking layer (EBL) is to prevent electrons from being transferred from the emission layer to the hole transport layer and thereby confine electrons to the emission layer. Thereby, efficiency, operating voltage and/or lifetime are improved. Typically, the electron blocking layer comprises a triarylamine compound. The triarylamine compound may have a LUMO level closer to vacuum level than the LUMO level of the hole transport layer. The electron blocking layer may have a HOMO level that is further away from vacuum level compared to the HOMO level of the hole transport layer. The thickness of the electron blocking layer may be selected between 2 and 20 nm.

The electron blocking layer may comprise a compound of formula Z below (Z).

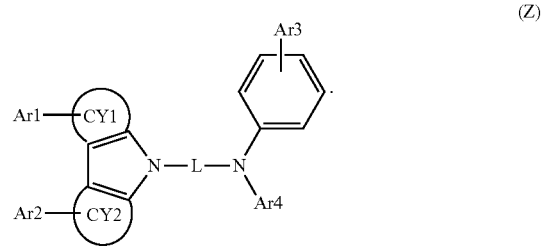

(Z)

In Formula Z, CY1 and CY2 are the same as or different from each other, and each independently represent a benzene cycle or a naphthalene cycle, Ar1 to Ar3 are the same as or different from each other, and each independently selected from the group consisting of hydrogen; a substituted or unsubstituted aryl group having 6 to 30 carbon atoms; and a substituted or unsubstituted heteroaryl group having 5 to 30 carbon atoms, Ar4 is selected from the group consisting of a substituted or unsubstituted phenyl group, a substituted or unsubstituted biphenyl group, a substituted or unsubstituted terphenyl group, a substituted or unsubstituted triphenylene group, and a substituted or unsubstituted heteroaryl group having 5 to 30 carbon atoms, L is a substituted or unsubstituted arylene group having 6 to 30 carbon atoms.

If the electron blocking layer has a high triplet level, it may also be described as triplet control layer.

The function of the triplet control layer is to reduce quenching of triplets if a phosphorescent green or blue emission layer is used. Thereby, higher efficiency of light emission from a phosphorescent emission layer can be achieved. The triplet control layer is selected from triarylamine compounds with a triplet level above the triplet level of the phosphorescent emitter in the adjacent emission layer. Suitable compounds for the triplet control layer, in particular the triarylamine compounds, are described in EP 2 722 908 A1.

Emission Layer (EML)

The EML may be formed on the HTL by vacuum deposition, spin coating, slot-die coating, printing, casting, LB deposition, or the like. When the EML is formed using vacuum deposition or spin coating, the conditions for deposition and coating may be similar to those for the formation of the HIL. However, the conditions for deposition and coating may vary, according to the compound that is used to form the EML.

The emission layer (EML) may be formed of a combination of a host and an emitter dopant. Example of the host are Alq3, 4,4'-N,N'-dicarbazole-biphenyl (CBP), poly(n-vinylcarbazole) (PVK), 9,10-di(naphthalene-2-yl)anthracene (ADN), 4,4',4"-tris(carbazol-9-yl)-triphenylamine(TCTA), 1,3,5-tris(N-phenylbenzimidazole-2-yl)benzene (TPBI), 3-tert-butyl-9,10-di-2-naphthylanthracenee (TBADN), distyrylarylene (DSA), bis(2-(2-hydroxyphenyl)benzo-thiazolate)zinc (Zn(BTZ)$_2$), G3 below, AND Compound 1 below, and Compound 2 below.

G3

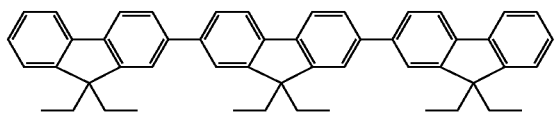

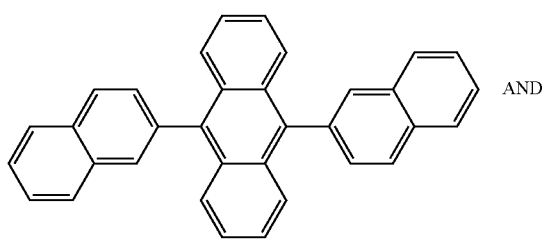

AND

Compound 1

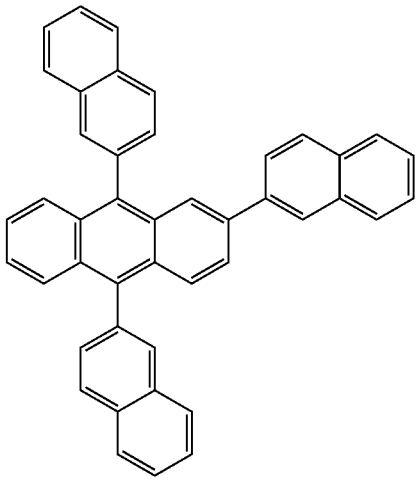

Compound 2

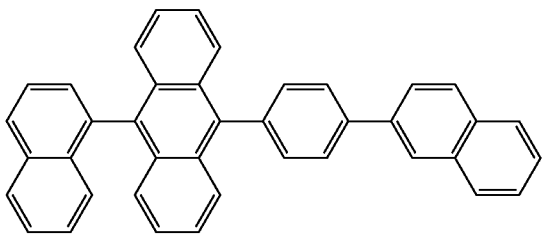

The emitter dopant may be a phosphorescent or fluorescent emitter. Phosphorescent emitters and emitters which emit light via a thermally activated delayed fluorescence (TADF) mechanism may be preferred due to their higher efficiency. The emitter may be a small molecule or a polymer.

Examples of red emitter dopants are PtOEP, Ir(piq)$_3$, Btp$_2$Ir(acac), but are not limited thereto. These compounds are phosphorescent emitters, however, fluorescent red emitter dopants could also be used.

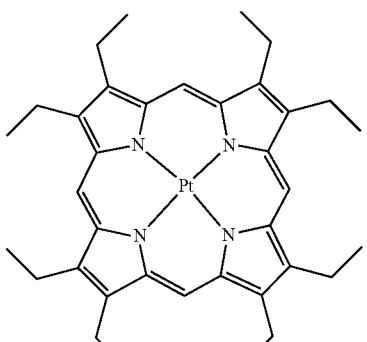

PtOEP

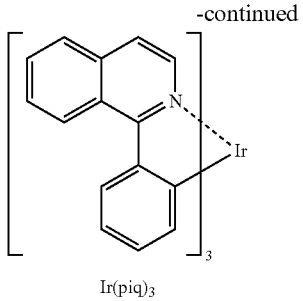

Ir(piq)₃

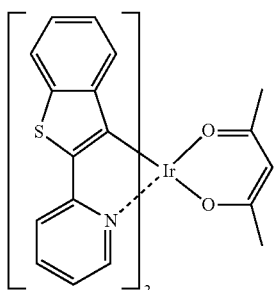

Btp₂Ir(acac)

Examples of phosphorescent green emitter dopants are Ir(ppy)₃ (ppy=phenylpyridine), Ir(ppy)₂(acac), Ir(mpyp)₃ are shown below. Compound 3 is an example of a fluorescent green emitter and the structure is shown below.

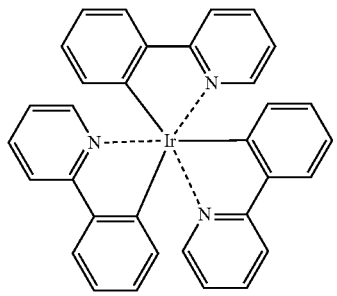

Ir(ppy)₃

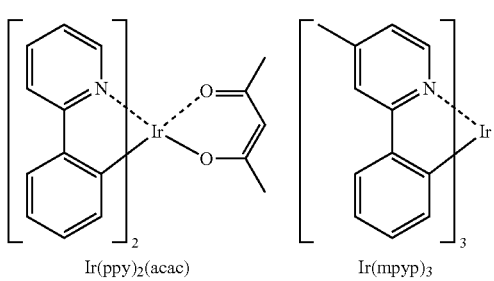

Ir(ppy)₂(acac)    Ir(mpyp)₃

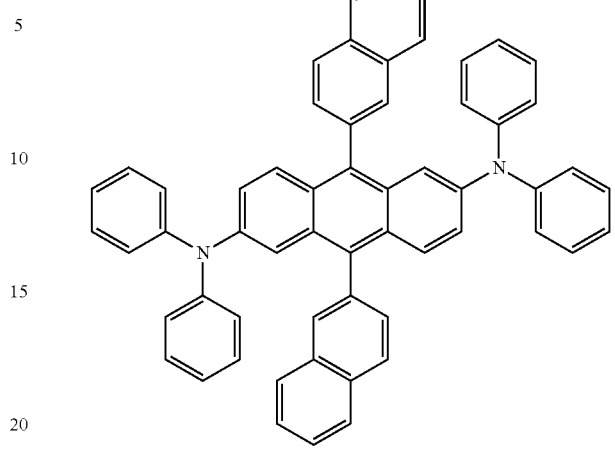

Compound 3

Examples of phosphorescent blue emitter dopants are F2Irpic, (F2ppy)2Ir(tmd) and Ir(dfppz)3, ter-fluorene, the structures are shown below. 4,4'-bis(4-diphenyl amiostyryl) biphenyl (DPAVBi), 2,5,8,11-tetra-tert-butyl perylene (TBPe), and Compound 4 below are examples of fluorescent blue emitter dopants.

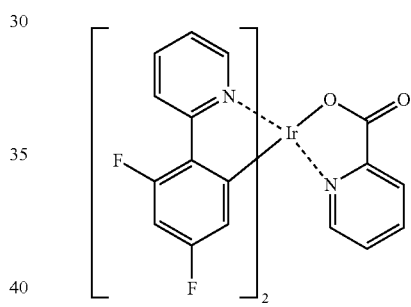

F2Irpic

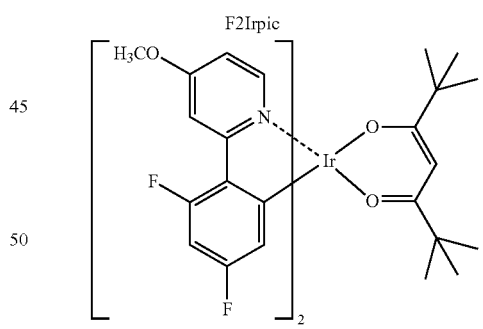

(F2ppy)2Ir(tmd)

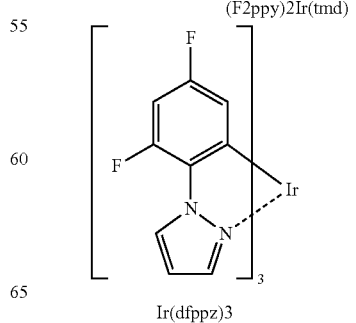

Ir(dfppz)3

Compound 4

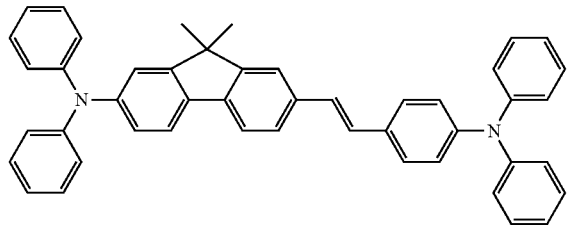

The amount of the emitter dopant may be in the range from about 0.01 to about 50 parts by weight, based on 100 parts by weight of the host. Alternatively, the emission layer may consist of a light-emitting polymer. The EML may have a thickness of about 10 nm to about 100 nm, for example, from about 20 nm to about 60 nm. When the thickness of the EML is within this range, the EML may have excellent light emission, without a substantial penalty in driving voltage.

Hole Blocking Layer (HBL)

A hole blocking layer (HBL) may be formed on the EML, by using vacuum deposition, spin coating, slot-die coating, printing, casting, LB deposition, or the like, in order to prevent the diffusion of holes into the ETL. When the EML comprises a phosphorescent dopant, the HBL may have also a triplet exciton blocking function.

When the HBL is formed using vacuum deposition or spin coating, the conditions for deposition and coating may be similar to those for the formation of the HIL. However, the conditions for deposition and coating may vary, according to the compound that is used to form the HBL. Any compound that is commonly used to form a HBL may be used. Examples of compounds for forming the HBL include oxadiazole derivatives, triazole derivatives, and phenanthroline derivatives.

The HBL may have a thickness in the range from about 5 nm to about 100 nm, for example, from about 10 nm to about 30 nm. When the thickness of the HBL is within this range, the HBL may have excellent hole-blocking properties, without a substantial penalty in driving voltage.

Electron Transport Layer (ETL)

The OLED according to the present invention may contain an electron transport layer (ETL). The electron transport layer may comprise or consist of the inventive inverse coordination complex.

According to various embodiments the OLED may comprises an electron transport layer or an electron transport layer stack comprising at least a first electron transport layer and at least a second electron transport layer.

By suitably adjusting energy levels of particular layers of the ETL, the injection and transport of the electrons may be controlled, and the holes may be efficiently blocked. Thus, the OLED may have long lifetime.

The electron transport layer of the electronic device may comprise an organic electron transport matrix (ETM) material. Further, the electron transport layer may comprise one or more n-dopants. Suitable compounds for the ETM are not particularly limited. In one embodiment, the electron transport matrix compounds consist of covalently bound atoms. Preferably, the electron transport matrix compound comprises a conjugated system of at least 6, more preferably of at least 10 delocalized electrons. In one embodiment, the conjugated system of delocalized electrons may be comprised in aromatic or heteroaromatic structural moieties, as disclosed e.g. in documents EP 1 970 371 A1 or WO 2013/079217 A1.

Electron Injection Layer (EIL)

The optional EIL, which may facilitates injection of electrons from the cathode, may be formed on the ETL, preferably directly on the electron transport layer. The electron injection layer may comprise or consists of the inverse coordination complex. Examples of materials for forming the EIL include lithium 8-hydroxyquinolinolate (LiQ), LiF, NaCl, CsF, $Li_2O$, BaO, Ca, Ba, Yb, Mg which are known in the art. Deposition and coating conditions for forming the EIL are similar to those for formation of the HIL, although the deposition and coating conditions may vary, according to the material that is used to form the EIL.

The thickness of the EIL may be in the range from about 0.1 nm to about 10 nm, for example, in the range from about 0.5 nm to about 9 nm. When the thickness of the EIL is within this range, the EIL may have satisfactory electron-injecting properties, without a substantial penalty in driving voltage.

Cathode Electrode

The cathode electrode is formed on the EIL if present. The cathode electrode may be formed of a metal, an alloy, an electrically conductive compound, or a mixture thereof. The cathode electrode may have a low work function. For example, the cathode electrode may be formed of lithium (Li), magnesium (Mg), aluminum (Al), aluminum (Al)-lithium (Li), calcium (Ca), barium (Ba), ytterbium (Yb), magnesium (Mg)-indium (In), magnesium (Mg)-silver (Ag), or the like. Alternatively, the cathode electrode may be formed of a transparent conductive oxides, such as ITO or IZO.

The thickness of the cathode electrode may be in the range from about 5 nm to about 1000 nm, for example, in the range from about 10 nm to about 100 nm. When the thickness of the cathode electrode is in the range from about 5 nm to about 50 nm, the cathode electrode may be transparent or semitransparent even if formed from a metal or metal alloy.

It is to be understood that the cathode electrode is not part of an electron injection layer or the electron transport layer.

Charge Generation Layer/Hole Generating Layer

The charge generation layer (CGL) may be composed of a double layer. The charge generation layer, the n-type charge generation layer as well as the hole generation layer, may comprise or consist of the inverse coordination complex.

Typically, the charge generation layer is a pn junction joining a n-type charge generation layer (electron generating layer) and a hole generating layer. The n-side of the pn junction generates electrons and injects them into the layer which is adjacent in the direction to the anode. Analogously, the p-side of the p-n junction generates holes and injects them into the layer which is adjacent in the direction to the cathode.

Charge generating layers are used in tandem devices, for example, in tandem OLEDs comprising, between two electrodes, two or more emission layers. In aa tandem OLED comprising two emission layers, the n-type charge generation layer provides electrons for the first light emission layer arranged near the anode, while the hole generating layer provides holes to the second light emission layer arranged between the first emission layer and the cathode.

In accordance with the invention, it may be provided that the electronic device comprises a hole injection layer as well as a hole generating layer. If the hole injection layer comprises the inverse coordination complex, it is not obligatory that also the hole generating layer comprises the inverse coordination complex. In such a case, the hole generating layer can be composed of an organic matrix material doped with p-type dopant. Suitable matrix materials for the hole generating layer may be materials conventionally used as hole injection and/or hole transport matrix materials. Also, p-type dopant used for the hole generating layer can employ conventional materials. For example, the p-type dopant can be one selected from a group consisting of tetrafluore-7,7,8,8-tetracyanoquinodimethane (F4-TCNQ), derivatives of tetracyanoquinodimethane, radialene derivatives, iodine, FeCl3, FeF3, and SbCl5. Also, the host can be one selected from a group consisting of N,N'-di(naphthalen-1-yl)-N,N-diphenyl-benzidine (NPB), N,N'-diphenyl-N,N'-bis(3-methylphenyl)-1,1-biphenyl-4,4'-diamine (TPD) and N,N',N'-tetranaphthyl-benzidine (TNB).

In a preferred embodiment, the hole generating layer comprises or consists of the inverse coordination complex as defined above in detail.

The n-type charge generation layer can be layer of a neat n-dopant, for example of an electropositive metal, or can consist of an organic matrix material doped with the n-dopant. In one embodiment, the n-type dopant can be alkali metal, alkali metal compound, alkaline earth metal, or alkaline earth metal compound. In another embodiment, the metal can be one selected from a group consisting of Li, Na, K, Rb, Cs, Mg, Ca, Sr, Ba, La, Ce, Sm, Eu, Tb, Dy, and Yb. More specifically, the n-type dopant can be one selected from a group consisting of Cs, K, Rb, Mg, Na, Ca, Sr, Eu and Yb. Suitable matrix materials for the electron generating layer may be the materials conventionally used as matrix materials for electron injection or electron transport layers. The matrix material can be for example one selected from a group consisting of triazine compounds, hydroxyquinoline derivatives like tris(8-hydroxyquinoline)aluminum, benzazole derivatives, and silole derivatives.

In one embodiment, the n-type charge generation layer may include compounds of the following Chemical Formula X.

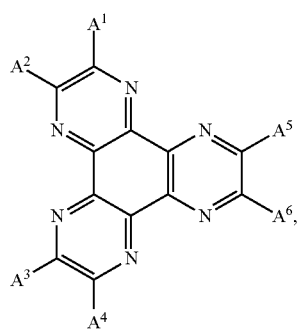

wherein each of A1 to A6 may be hydrogen, a halogen atom, nitrile (—CN), nitro (—NO2), sulfonyl (—SO2R), sulfoxide (—SOR), sulfonamide (—SO2NR), sulfonate (—SO3R), trifluoromethyl (—CF3), ester (—COOR), amide (—CONHR or —CONRR'), substituted or unsubstituted straight-chain or branched-chain C1-C12 alkoxy, substituted or unsubstituted straight-chain or branched-chain C1-C12 alkyl, substituted or unsubstituted straight-chain or branched chain C2-C12 alkenyl, a substituted or unsubstituted aromatic or non-aromatic heterogring, substituted or unsubstituted aryl, substituted or unsubstituted mono- or di-arylamine, substituted or unsubstituted aralkylamine, or the like. Herein, each of the above R and R' may be substituted or unsubstituted C1-C60 alkyl, substituted or unsubstituted aryl, or a substituted or unsubstituted 5- to 7-membered heterogring, or the like.

An example of such n-type charge generation layer may be a layer comprising CNHAT

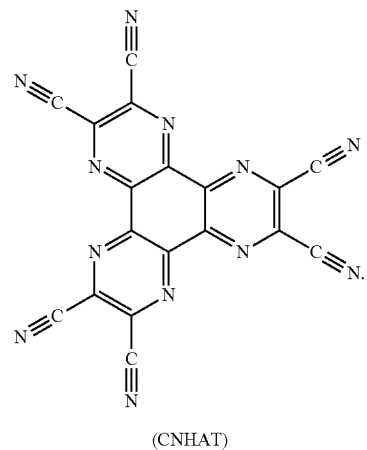

(CNHAT)

The hole generating layer is arranged on top of the n-type charge generation layer.

Organic Light-Emitting Diode (OLED)

According to one aspect of the present invention, there is provided an organic light-emitting diode (OLED) comprising: a substrate; an anode electrode formed on the substrate; a hole injection layer, a hole transport layer, an emission layer, and a cathode electrode.

According to another aspect of the present invention, there is provided an OLED comprising: a substrate; an anode electrode formed on the substrate; a hole injection layer, a hole transport layer, an electron blocking layer, an emission layer, a hole blocking layer and a cathode electrode.

According to another aspect of the present invention, there is provided an OLED comprising: a substrate; an anode electrode formed on the substrate; a hole injection layer, a hole transport layer, an electron blocking layer, an emission layer, a hole blocking layer, an electron transport layer, and a cathode electrode.

According to another aspect of the present invention, there is provided an OLED comprising: a substrate; an anode electrode formed on the substrate; a hole injection layer, a hole transport layer, an electron blocking layer, an emission layer, a hole blocking layer, an electron transport layer, an electron injection layer, and a cathode electrode.

According to various embodiments of the present invention, there may be provided OLEDs comprising layers arranged between the above mentioned layers, on the substrate or on the top electrode.

According to one aspect, the OLED can comprise a layer structure of a substrate that is adjacent arranged to an anode electrode, the anode electrode is adjacent arranged to a first hole injection layer, the first hole injection layer is adjacent arranged to a first hole transport layer, the first hole transport layer is adjacent arranged to a first electron blocking layer, the first electron blocking layer is adjacent arranged to a first emission layer, the first emission layer is adjacent arranged to a first electron transport layer, the first electron transport layer is adjacent arranged to an n-type charge generation layer, the n-type charge generation layer is adjacent arranged to a hole generating layer, the hole generating layer is adjacent arranged to a second hole transport layer, the second hole transport layer is adjacent arranged to a second electron blocking layer, the second electron blocking layer is adjacent arranged to a second emission layer, between the second emission layer and the cathode electrode an optional electron transport layer and/or an optional injection layer are arranged.

For example, the OLED according to FIG. 2 may be formed by a process, wherein generating layers between the first electrode and the second electrode. In case that electronic device only comprises the hole injection layer (and not the hole generating layer) it is provided that the hole injection layer consists of the inverse coordination complex. Likewise, in the case that the electronic device comprises only the hole generating layer (and not the hole injection layer) it is provided that the hole generating layer consists of the inverse coordination complex. In case that the electronic device comprises both the hole injection layer and the hole generating layer, it may be provided that only the hole injection layer consists of the inverse coordination complex, that only the hole generating layer consists of the inverse coordination complex or that both the hole injection layer and the hole generating layer consist of the inverse coordination complex.

In the above definition of the invention, reference is made to the electronegativity values according to Allen. According to Allen, the electronegativity of an atom is related to the average energy of the valence electrons in a free atom thereof. The electronegativity values according to Allen are as follows. For lanthanide elements La, Ce, Pr, Nd, Sm, Eu, Gd, Tb, Dy, Ho, Er, Tm, Yb, it is assumed that Allen electronegativity is less than 1.15, for Th and U, it is assumed that Allen electronegativity is less than 1.5.

Electronegativity using the Allen scale

| Period | Group |   |   |   |   |   |   |   |   |   |   |   |   |   |   |   |   |   |
|---|---|---|---|---|---|---|---|---|---|---|---|---|---|---|---|---|---|---|
|  | 1 | 2 | 3 | 4 | 5 | 6 | 7 | 8 | 9 | 10 | 11 | 12 | 13 | 14 | 15 | 16 | 17 | 18 |
| 1 | H 2.300 | | | | | | | | | | | | | | | | | He 4.160 |
| 2 | Li 0.912 | Be 1.576 | | | | | | | | | | | B 2.051 | C 2.544 | N 3.066 | O 3.610 | F 4.193 | Ne 4.787 |
| 3 | Na 0.869 | Mg 1.293 | | | | | | | | | | | Al 1.613 | Si 1.916 | P 2.253 | S 2.589 | Cl 2.869 | Ar 3.242 |
| 4 | K 0.734 | Ca 1.034 | Sc 1.19 | Ti 1.38 | V 1.53 | Cr 1.65 | Mn 1.75 | Fe 1.80 | Co 1.84 | Ni 1.88 | Cu 1.85 | Zn 1.59 | Ga 1.756 | Ge 1.994 | As 2.211 | Se 2.424 | Br 2.685 | Kr 2.966 |
| 5 | Rb 0.706 | Sr 0.963 | Y 1.12 | Zr 1.32 | Nb 1.41 | Mo 1.47 | Tc 1.51 | Ru 1.54 | Rh 1.56 | Pd 1.58 | Ag 1.87 | Cd 1.52 | In 1.656 | Sn 1.824 | Sb 1.984 | Te 2.158 | I 2.359 | Xe 2.582 |
| 6 | Cs 0.659 | Ba 0.881 | Lu 1.09 | Hf 1.16 | Ta 1.34 | W 1.47 | Re 1.60 | Os 1.65 | Ir 1.68 | Pt 1.72 | Au 1.92 | Hg 1.76 | Tl 1.789 | Pb 1.854 | Bi 2.01 | Po 2.19 | At 2.39 | Rn 2.60 |
| 7 | Fr 0.67 | Ra 0.89 | | | | | | | | | | | | | | | | | on a substrate (110), an anode (120), a hole injection layer (130), a hole transport layer (140), an electron blocking layer (145), an emission layer (150), a hole blocking layer (155), an electron transport layer (160), an electron injection layer (180) and the cathode electrode (190) are subsequently formed in that order.

Details and Definitions of the Invention

The present invention is related to an organic electronic device. The device comprises a first electrode and a second electrode. Between the first electrode and the second electrode, at least one hole injection layer and/or at least one hole transport layer and/or at least one hole generating layer is arranged. That is, the electronic device may only comprise a hole injection layer between the first electrode and the second electrode. Likewise, the inventive electronic device may only comprise the hole transport layer between the first electrode and the second electrode. Likewise, the inventive electronic device may only comprise the hole generating layer between the first electrode and the second electrode. Likewise, the electronic device may comprise only two or all three of the above hole injection, hole transport or hole In terms of the present invention, a "covalent cluster" comprises of at least two atoms bound to each other via a covalent chemical bond. It may, of course, be provided that the covalent cluster comprises more than two atoms provided that all of the atoms are connected with each other via covalent bonds.

In general terms, a coordination complex refers a compound having the formula $ML_n$ in which one metal-ion or atom M is surrounded by one or more ligands L. In such a case, the ligands L are normally bond to the metal M via a dative bond, i.e. via the electrons of a free electron pair of the ligand which is transferred into a free orbital of the metal. In terms of the present invention, an inverse coordination complex is such a complex in which a core (normally having free electron pairs) is connected to a first coordination sphere of atoms having free orbitals, normally metal atoms or ions. Therefore, referring to the above formula, a coordination complex in terms of the present application may be considered to have the structure—generic—$XM_n$ wherein the electropositive elements M form the first coordination sphere around an electronegative core X.

Electropositive in this regard refers to elements which have, according to Allen, a lower electronegativity than the atoms of the core.

With respect to the preferred electronegativity values mentioned above, it should be noted that, of course, these preferred values have always to be read in context of claim 1. I.e. the requirement that all atoms of the core have a higher electronegativity according to Allen then any of the electropositive atoms of the first coordination sphere has always to be fulfilled.

The term "hydrocarbyl group" as used herein shall be understood to encompass any organic group comprising carbon atoms, in particular organic groups, such as alkyl, aryl, heteroaryl, heteroalkyl, in particular such groups which are substituents usual in organic electronics.

The term "alkyl" as used herein shall encompass linear as well as branched and cyclic alkyl. For example, $C_3$-alkyl may be selected from n-propyl and iso-propyl. Likewise, $C_4$-alkyl encompasses n-butyl, sec-butyl and t-butyl. Likewise, $C_6$-alkyl encompasses n-hexyl and cyclo-hexyl.

The subscribed number n in $C_n$ relates to the total number of carbon atoms in the respective alkyl, arylene, heteroarylene or aryl group.

The term "aryl" as used herein shall encompass phenyl ($C_6$-aryl), fused aromatics, such as naphthalene, anthracene, phenanthrene, tetracene etc. Further encompassed are biphenyl and oligo- or polyphenyls, such as terphenyl etc. Further encompassed shall be any further aromatic hydrocarbon substituents, such as fluorenyl etc. Arylene, respectively heteroarylene refers to groups to which two further moieties are attached.

The term "heteroaryl" as used herein refers to aryl groups in which at least one carbon atom is substituted by a heteroatom, preferably selected from N, O, S, B or Si.

The term "halogenated" refers to an organic compound in which one hydrogen atom thereof is replaced by a halogen atom. The term "perhalogenated" refers to an organic compound in which all of the hydrogen atoms thereof are replaced by halogen atoms. The meaning of the terms "fluorinated" and "perfluorinated" should be understood analogously.

The subscripted number n in $C_n$-heteroaryl merely refers to the number of carbon atoms excluding the number of heteroatoms. In this context, it is clear that a $C_3$ heteroarylene group is an aromatic compound comprising three carbon atoms, such as pyrazol, imidazole, oxazole, thiazole and the like.

In terms of the invention, the expression "between" with respect to one layer being between two other layers does not exclude the presence of further layers which may be arranged between the one layer and one of the two other layers. In terms of the invention, the expression "in direct contact" with respect to two layers being in direct contact with each other means that no further layer is arranged between those two layers. One layer deposited on the top of another layer is deemed to be in direct contact with this layer.

With respect to the inventive organic semiconductive layer as well as with respect to the inventive compound, the compounds mentioned in the experimental part are most preferred.

The inventive electronic device may be an organic electroluminescent device (OLED) an organic photovoltaic device (OPV) or an organic field-effect transistor (OFET).

According to another aspect, the organic electroluminescent device according to the present invention may comprise more than one emission layer, preferably two or three emission layers. An OLED comprising more than one emission layer is also described as a tandem OLED or stacked OLED.

The organic electroluminescent device (OLED) may be a bottom- or top-emission device.

Another aspect is directed to a device comprising at least one organic electroluminescent device (OLED). A device comprising organic light-emitting diodes is for example a display or a lighting panel.

In the present invention, the following defined terms, these definitions shall be applied, unless a different definition is given in the claims or elsewhere in this specification.

In the context of the present specification the term "different" or "differs" in connection with the matrix material means that the matrix material differs in their structural formula.

The energy levels of the highest occupied molecular orbital, also named HOMO, and of the lowest unoccupied molecular orbital, also named LUMO, are measured in electron volt (eV).

The terms "OLED" and "organic light-emitting diode" are simultaneously used and have the same meaning. The term "organic electroluminescent device" as used herein may comprise both organic light emitting diodes as well as organic light emitting transistors (OLETs).

As used herein, "weight percent", "wt.-%", "percent by weight", "% by weight", and variations thereof refer to a composition, component, substance or agent as the weight of that component, substance or agent of the respective electron transport layer divided by the total weight of the respective electron transport layer thereof and multiplied by too. It is under-stood that the total weight percent amount of all components, substances and agents of the respective electron transport layer and electron injection layer are selected such that it does not exceed 100 wt.-%.

As used herein, "volume percent", "vol.-%", "percent by volume", "% by volume", and variations thereof refer to a composition, component, substance or agent as the volume of that component, substance or agent of the respective electron transport layer divided by the total volume of the respective electron transport layer thereof and multiplied by 100. It is understood that the total volume percent amount of all components, substances and agents of the cathode layer are selected such that it does not exceed 100 vol.-%.

All numeric values are herein assumed to be modified by the term "about", whether or not explicitly indicated. As used herein, the term "about" refers to variation in the numerical quantity that can occur. Whether or not modified by the term "about" the claims include equivalents to the quantities.

It should be noted that, as used in this specification and the appended claims, the singular forms "a", "an", and "the" include plural referents unless the content clearly dictates otherwise.

The term "free of", "does not contain", "does not comprise" does not exclude impurities. Impurities have no technical effect with respect to the object achieved by the present invention.

BRIEF DESCRIPTION OF THE DRAWINGS

These and/or other aspects and advantages of the present invention will become apparent and more readily appreciated from the following description of the exemplary embodiments, taken in conjunction with the accompanying drawings, of which.

EMBODIMENTS OF THE INVENTIVE DEVICE

Figure 1:
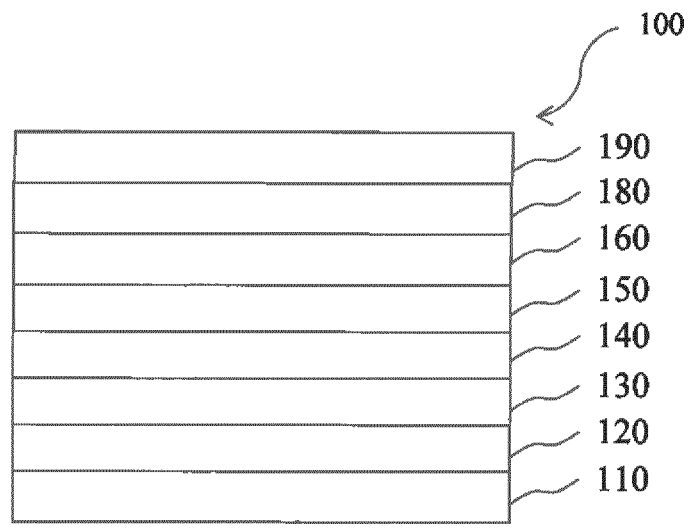
FIG. 1 is a schematic sectional view of an organic light-emitting diode (OLED), according to an exemplary embodiment of the present invention.

Reference will now be made in detail to the exemplary embodiments of the present invention, examples of which are illustrated in the accompanying drawings, wherein like reference numerals refer to the like elements throughout. The exemplary embodiments are described below, in order to explain the aspects of the present invention, by referring to the figures.

Herein, when a first element is referred to as being formed or disposed "on" a second element, the first element can be disposed directly on the second element, or one or more other elements may be disposed there between. When a first element is referred to as being formed or disposed "directly on" a second element, no other elements are disposed there between.

FIG. 1 is a schematic sectional view of an organic light-emitting diode (OLED) 100, according to an exemplary embodiment of the present invention. The OLED 100 includes a substrate 110, an anode 120, a hole injection layer (HIL) 130, a hole transport layer (HTL) 140, an emission layer (EML) 150, an electron transport layer (ETL) 160. The electron transport layer (ETL) 160 is formed directly on the EML 150. Onto the electron transport layer (ETL) 160, an electron injection layer (EIL) 180 is disposed. The cathode 190 is disposed directly onto the electron injection layer (EIL) 180.

Instead of a single electron transport layer 160, optionally an electron transport layer stack (ETL) can be used.

Figure 2:
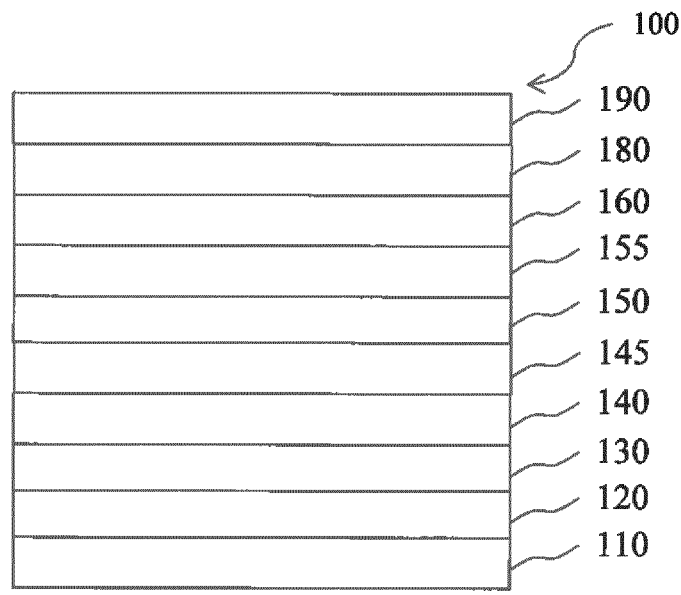
FIG. 2 is a schematic sectional view of an OLED, according to an exemplary embodiment of the present invention.

FIG. 2 is a schematic sectional view of an OLED 100, according to another exemplary embodiment of the present invention. FIG. 2 differs from FIG. 1 in that the OLED 100 of FIG. 2 comprises an electron blocking layer (EBL) 145 and a hole blocking layer (HBL) 155.

Referring to FIG. 2, the OLED 100 includes a substrate 110, an anode 120, a hole injection layer (HIL) 130, a hole transport layer (HTL) 140, an electron blocking layer (EBL) 145, an emission layer (EML) 150, a hole blocking layer (HBL) 155, an electron transport layer (ETL) 160, an electron injection layer (EIL) 180 and a cathode electrode 190.

Figure 3:
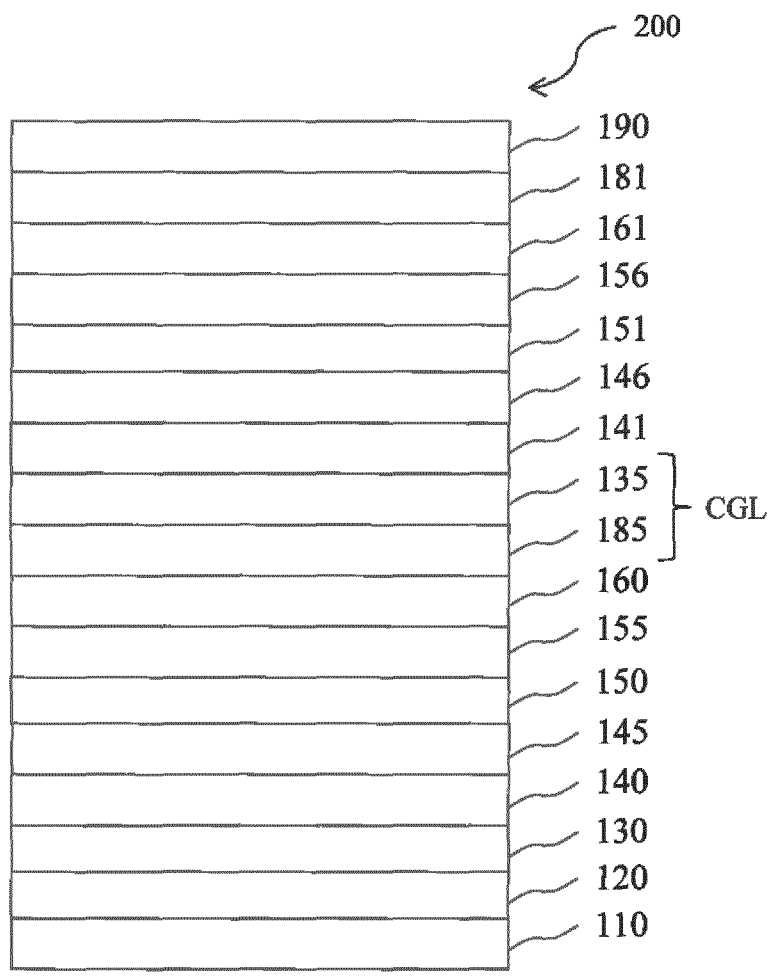
FIG. 3 is a schematic sectional view of a tandem OLED comprising a charge generation layer, according to an exemplary embodiment of the present invention.
Figure 4:
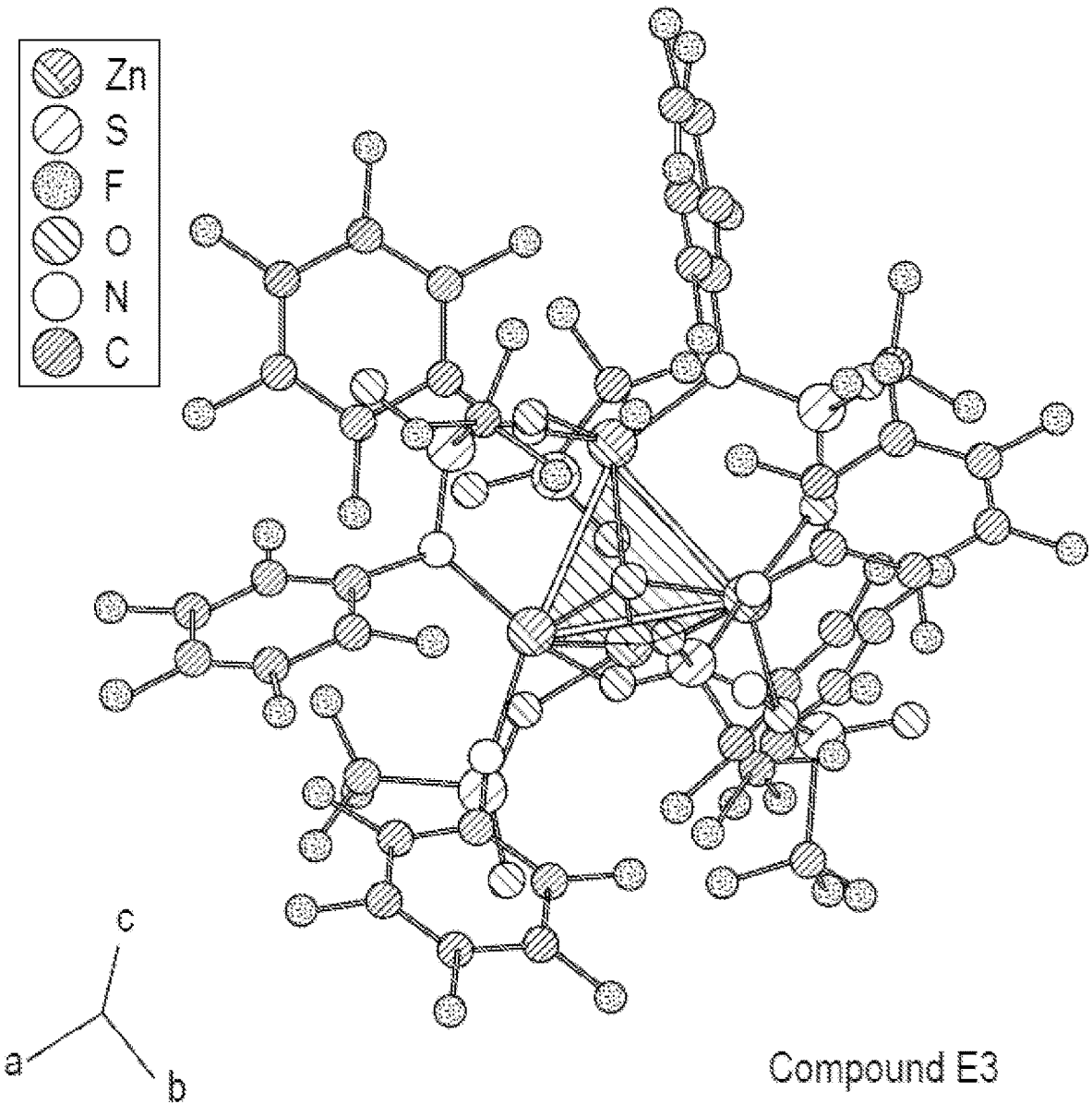
FIG. 4 shows the crystal structure of the inventive inverse coordination complex $E_3$, having the summary formula $C_{42}F_{48}N_6O_{13}S_6Zn_4$.

FIG. 3 is a schematic sectional view of a tandem OLED 200, according to another exemplary embodiment of the present invention. FIG. 3 differs from FIG. 2 in that the OLED 100 of FIG. 3 further comprises a charge generation layer and a second emission layer.

Referring to FIG. 3, the OLED 200 includes a substrate 110, an anode 120, a first hole injection layer (HIL) 130, a first hole transport layer (HTL) 140, a first electron blocking layer (EBL) 145, a first emission layer (EML) 150, a first hole blocking layer (HBL) 155, a first electron transport layer (ETL) 160, an n-type charge generation layer (n-type CGL) 185, a hole generating layer (p-type charge generation layer; p-type GCL) 135, a second hole transport layer (HTL) 141, a second electron blocking layer (EBL) 146, a second emission layer (EML) 151, a second hole blocking layer (EBL) 156, a second electron transport layer (ETL) 161, a second electron injection layer (EIL) 181 and a cathode 190.

While not shown in FIG. 1, FIG. 2 and FIG. 3, a sealing layer may further be formed on the cathode electrodes 190, in order to seal the OLEDs 100 and 200. In addition, various other modifications may be applied thereto.

Hereinafter, one or more exemplary embodiments of the present invention will be described in detail with, reference to the following examples. However, these examples are not intended to limit the purpose and scope of the one or more exemplary embodiments of the present invention.

Experimental Part

Preparation of Inventive Metal Complexes

Exemplary Compound E2
The Compound Has Been Prepared According to Scheme 1

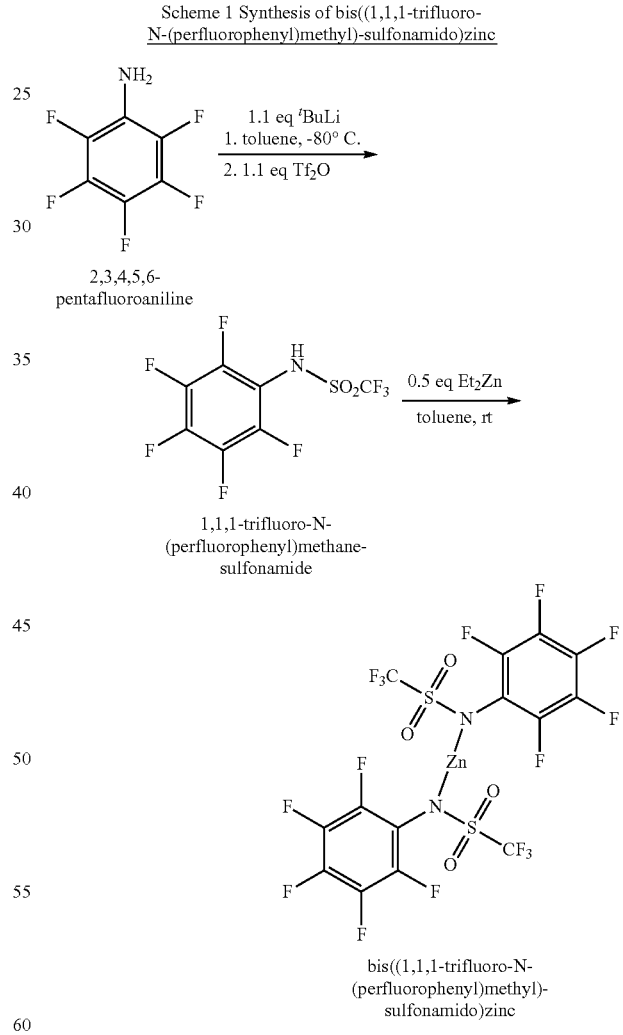

Step 1: Synthesis of 1,1,1-trifluoro-N-(perfluorophenyl)methanesulfonamide

A 250 mL Schlenk flask was heated in vacuum and after cooling was purged with nitrogen. Perfluoroaniline was dissolved in 100 mL toluene and the solution was cooled to −80° C. A 1.7 M t-Butyllithium solution was added dropwise via syringe over 10 min. The reaction solution changed from clear to cloudy and was stirred for 1 h at −80° C. After that, the solution was allowed to warm to −60° C. and 1.1 eq of trifluoromethanesulfonic anhydride was added dropwise to the solution. Then the cooling bath was removed and the reaction mixture was allowed to warm slowly to ambient temperature and stirred overnight, whereby the color changed to light orange. Additionally, a white solid formed. The precipitated by-product lithium trifluoromethanesulfonate was filtered off by suction filtration over a sintered glass filter and washed with 2×30 mL toluene and 30 mL n-hexane. The orange filtrate was evaporated and dried in high vacuum forming crystals. The crude product was then purified by bulb-to-bulb distillation (135° C. @ 1.2×10$^{-1}$ mbar) resulting in a crystalline colorless solid (main fraction).

$^1$H NMR [d$^6$-DMSO, ppm] δ: 13.09 (s, 1H, N-H).

$^{13}$C{$^1$H} NMR [d$^6$-DMSO, ppm] δ: 116.75 (m, C$_i$-C$_6$F$_5$), 120.74 (q, $^1$J$_{CF}$=325 Hz, CF$_3$), 136.39, 138.35 (2 m, $^2$J$_{CF}$=247 Hz, m-C$_6$F$_5$), 137.08, 139.06 (2 m, $^2$J$_{CF}$=247 Hz, p-C$_6$F$_5$), 142.98, 144.93 (2 m, $^2$J$_{CF}$=247, Hz o-C$_6$F$_5$).

$^{19}$F NMR [d$^6$-DMSO, ppm] δ: −77.45 (m, CF$_3$), −148.12 (m, C$_6$F$_5$), −160.79 (m, p-C$_6$F$_5$), −164.51 (m, C$_6$F$_5$).

ESI-MS: m/z-neg=314 (M-H).

EI-MS: m/z=315 (M), 182 (M-SO$_2$CF$_3$), 69 (CF$_3$).

Step 2: Synthesis of bis((1,1,1-trifluoro-N-(perfluorophenyl)methyl)-sulfonamido)zinc A 100 mL Schlenk flask was heated in vacuum and after cooling was purged with nitrogen. 1,1,1-Trifluoro-N-(perfluorophenyl)methanesulfonarnide was dissolved in 10 mL toluene and 0.5 eq of diethylzinc in hexane was added dropwise to the solution via syringe at ambient temperature. During the addition a fog was forming and the reaction solution became jelly and cloudy. The solution was stirred for further 30 min at this temperature. After that, 30 mL n-hexane were added and a white precipitate formed, which was filtered over a sintered glass filter (pore 4) under inert atmosphere. The filter cake was twice washed with 15 mL n-hexane and dried in high vacuum at 100° C. for 2 h Yield: 660 mg (0.95 mmol, 60% based on 1,1,1-trifluoro-N-perfluorophenyl)methanesulfonamide) as a white solid.

$^{13}$C{$^1$H} NMR [d$^6$-DMSO, ppm] δ: 121.68 (q, $^1$J$_{CF}$=328 Hz, CF$_3$), 123.56 (m, C$_i$-C$_6$F$_5$), 133.98, 135.91 (2 m, $^2$J$_{CF}$=243 Hz, p-C$_6$F$_5$), 136.15, 138.13 (2 m, $^2$J$_{CF}$=249 Hz, m-C$_6$F$_5$), 142.33, 144.24 (2 m, $^2$J$_{CF}$=240, Hz o-C$_6$F$_5$).

$^{19}$F NMR [d$^6$-DMSO, ppm] δ: −77.52 (m, CF$_3$), −150.43 (m, C$_6$F$_5$), −166.77 (m, C$_6$F$_5$), −168.23 (m, p-C$_6$F$_5$).

ESI-MS: m/z-neg=314 (M-Zn-L).

EI-MS: m/z=692 (M), 559 (M-SO$_2$CF$_3$) 315 (C$_6$F$_5$NHSO$_2$CF$_3$), 182 (C$_6$F$_5$NH), 69 (CF$_3$).

Exemplary Compound E$_3$ 9.1 g E$_2$ has been sublimed at the temperature 240° C. and pressure 10$^{-3}$ Pa. yield 5.9 g (65%).

The sublimed material formed colorless crystals. One crystal of an appropriate shape and size (0.094×0.052×0.043 mm$^3$) has been closed under Ar atmosphere in a glass capillary and analyzed on Kappa Apex II diffractometer (Bruker-AXS, Karlsruhe, Germany) with monochromatic X-ray radiation from a source provided with molybdenum cathode (λ=71.073 pm). Overall 37362 reflexions were collected within the theta range 1.881 to 28.306°.

The structure was resolved by direct method (SHELXS-97, Sheldrick, 2008) and refined with a full-matrix least-squares method (SHELXL-2014/7, Olex2 (Dolomanov, 2017).

Further investigations showed that a complex having an oxygen dianion core tetrahedrally surrounded by four Zn dications bridged with six trifluoroacetate bidentate anionic ligands is similarly active as a p-dopant as compound E$_3$. This complex having composition C$_{12}$F$_{18}$O$_{13}$Zn$_4$ is obtainable by vacuum sublimation of a commercially available compound having CAS number 1299489-47-6 and according to XRD analysis of a monocrystal obtained by sublimation, it may form a trigonal crystal lattice belonging to the space group R-3c, with unit cell dimensions at the temperature 296 K a=23.376(6) Å, α=59.989(10)°; b=23.376(6) Å, β=59.989(10)°; c=23.376(6) Å; γ=59.989(10)°.

In the solid crystalline phase, the number of molecules having the chemical formula C$_{12}$F$_{18}$O$_{13}$Zn$_4$ and comprised in the unit cell of the crystal lattice may be Z=12.

In the solid crystalline phase, the unit cell volume at temperature 296 K may be 9030(7) Å$^3$ and calculated density may be 2.109 g/cm$^3$.

Device Experiments

Generic Procedures

OLEDs with two emitting layers were prepared to demonstrate the technical benefit of an organic electronic device comprising a hole injection layer and/or a hole generating layer according to the present invention. As proof-of-concept, the tandem OLEDs comprised two blue emitting layers.

A 15 Ω/cm$^2$ glass substrate with 90 nm ITO (available from Corning Co.) was cut to a size of 150 mm×150 mm×0.7 mm, ultrasonically cleaned with isopropyl alcohol for 5 minutes and then with pure water for 5 minutes, and cleaned again with UV ozone for 30 minutes, to prepare a first electrode.

The organic layers are deposited sequentially on the ITO layer at 10$^{-5}$ Pa, see Table 1 and 2 for compositions and layer thicknesses. In the Tables 1 to 3, c refers to the concentration, and d refers to the layer thickness.

Then, the cathode electrode layer is formed by evaporating aluminum at ultra-high vacuum of 10$^{-7}$ mbar and depositing the aluminum layer directly on the organic semiconductor layer. A thermal single co-evaporation of one or several metals is performed with a rate of 0, 1 to 10 nm/s (0.01 to 1 Å/s) in order to generate a homogeneous cathode electrode with a thickness of 5 to 1000 nm. The thickness of the cathode electrode layer is 100 nm.

The device is protected from ambient conditions by encapsulation of the device with a glass slide. Thereby, a cavity is formed, which comprises a getter material for further protection.

Current voltage measurements are performed at the temperature 20° C. using a Keithley 2400 source meter, and recorded in V.

Experimental Results

Materials Used in Device Experiments

The formulae of the supporting materials mentioned below are as follows:

F1 is

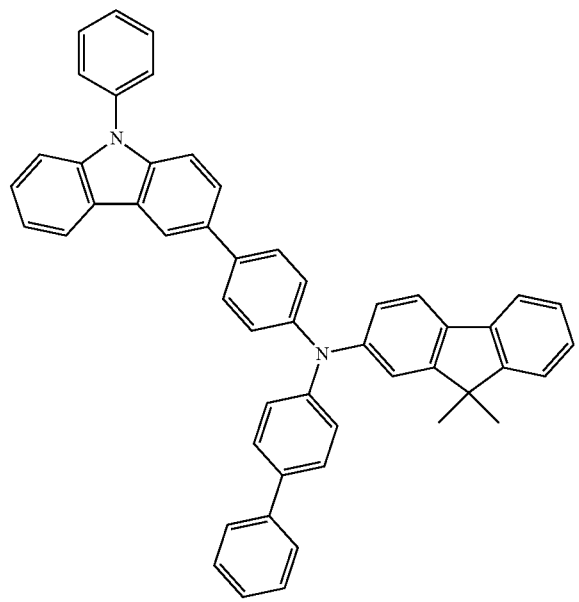 [SMILES: CC1(C)c2ccccc2-c2ccc(N(c3ccc(-c4ccccc4)cc3)c3ccc(-c4ccc5c(c4)c4ccccc4n5-c4ccccc4)cc3)cc21]

biphenyl-4-yl(9,9-diphenyl-9H-fluoren-2-yl)-[4-(9-phenyl-9H-carbazol-3-yl)phenyl]-amine, CAS 1242056-42-3;

F2 is

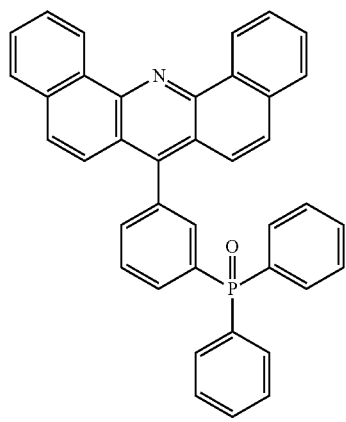 [SMILES: O=P(c1ccccc1)(c1ccccc1)c1cccc(-c2c3ccc4ccccc4c3nc3c2ccc2ccccc23)c1]

(3-(dibenzo[c,h]acridin-7-yl)phenyl)diphenylphosphine oxide, CAS 1440545-22-1;

F3 is

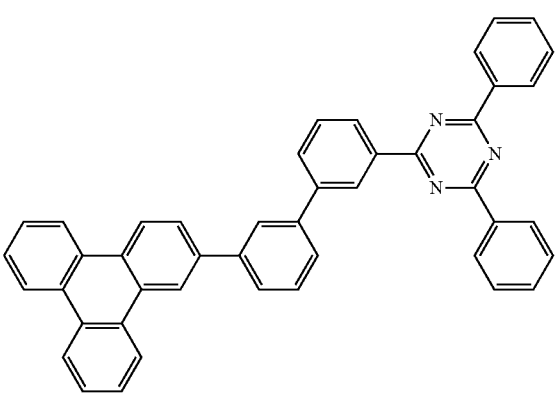 [SMILES: c1ccc(-c2nc(-c3ccccc3)nc(-c3cccc(-c4cccc(-c5ccc6c7ccccc7c7ccccc7c6c5)c4)c3)n2)cc1]

2,4-diphenyl-6-(3'-(triphenylen-2-yl)-[1,1'-biphenyl]-3-yl)-1,3,5-triazine, CAS 1638271-85-8;

F4 is

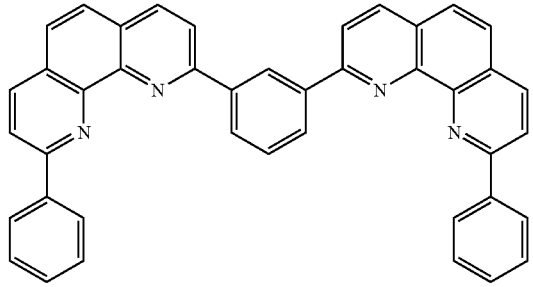 [SMILES: c1ccc(-c2ccc3ccc4ccc(-c5cccc(-c6ccc7ccc8ccc(-c9ccccc9)nc8c7n6)c5)nc4c3n2)cc1]

1,3-bis(9-phenyl-1,10-phenanthrolin-2-yl)benzene, CAS 721969-94-4;

PD-2 is

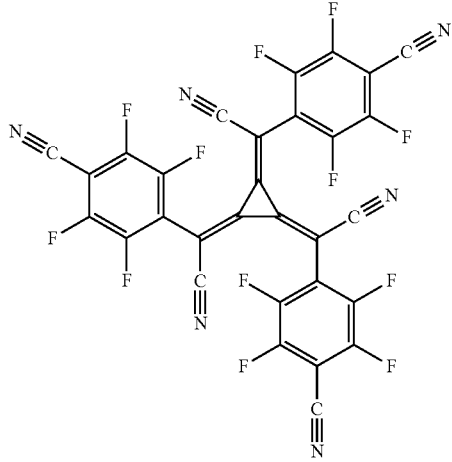 [SMILES: N#CC(=C1C(=C(C#N)c2c(F)c(F)c(C#N)c(F)c2F)C1=C(C#N)c1c(F)c(F)c(C#N)c(F)c1F)c1c(F)c(F)c(C#N)c(F)c1F]

4,4',4''-((1E,'E,1''E)-cyclopropane-1,2,3-triylidenetris (cyanomethanylylidene))tris(2,3,5,6-tetrafluorobenzonitrile), CAS 1224447-88-4.

LiQ is lithium 8-hydroxyquinolinolate; ZnPc is zinc phtalocyanine;

ABH-113 is an emitter host and NUBD-370 and DB-200 are blue fluorescent emitter dopants, all commercially available from SFC, Korea.

ITO is indium tin oxide.

Standard Procedures

Voltage Stability

OLEDs are driven by constant current circuits. Those can supply a constant current over a given voltage range. The wider the voltage range, the wider the power losses of such devices. Hence, the change of driving voltage upon driving needs to be minimized.

The driving voltage of an OLED is temperature dependent. Therefore, voltage stability needs to be judged in thermal equilibrium. Thermal equilibrium is reached after one hour of driving.

Voltage stability is measured by taking the difference of the voltage after 50 hours and after 1 hour driving at a constant current density. Here, a current density of 30 mA/cm$^2$ is used. Measurements are done at room temperature.

$$dU[V]=U(50\ h,\ 30\ mA/cm^2)-U(1\ h,\ 30\ mA/cm^2)$$

Example 1

Use of an inverse coordination complex as a neat hole injection layer in a blue OLED Table 1a schematically describes the model device.

TABLE 1a

| Material | c [wt %] | d [nm] |
|---|---|---|
| ITO | 100 | 90 |
| B2 or E3 | 100 | 3* |
| F1 | 100 | 120 |
| ABH113:NUBD370 | 97:3 | 20 |
| F2:LIQ | 50:50 | 36 |
| Al | 100 | 100 |

*E3 has been tested also as a layer only 1 nm thin.

The results are given in Table 1b

TABLE 1b

| | U* [V] | EQE* [%] | CIE-y* | U(50 h) − U(1 h)** [V] |
|---|---|---|---|---|
| 3 nm B2 (reference) | 5.28 | 6.6 | 0.090 | 0.275 |
| 3 nm E3 | 5.38 | 5.7 | 0.094 | 0.246 |
| 1 nm E3 | 5.11 | 5.4 | 0.096 | 0.040 |

*j = 15 mA/cm$^2$
**j = 30 mA/cm$^2$

This example shows that inverse coordination complexes are useful as a neat HIL comprised in an OLED.

Example 2

Use of an inverse coordination complex as a p-dopant a hole injection layer comprised in a blue OLED Table 2a schematically describes the model device.

TABLE 2a

| Material | c [wt %] | d [nm] |
|---|---|---|
| ITO | 100 | 90 |
| F1:p-dopant | 92:8 (mol %#) | 10 |
| F1 | 100 | 120 |
| ABH113:NUBD370 | 3 | 20 |
| F2:LiQ | 50 | 36 |
| Al | 100 | 100 | based on molar amount of metal atoms

The results are given Table 2b

TABLE 2b

| | U* [V] | EQE* [%] | CIE-y* | U(50 h) − U(1 h)** [V] |
|---|---|---|---|---|
| B2 (reference) | 8.06 | 7.1 | 0.095 | 0.639 |
| E3 | 5.15 | 5.7 | 0.094 | −0.015 |

*j = 15 mA/cm$^2$
**j = 30 mA/cm$^2$

This example shows that inverse coordination complexes are us p-dopants for a HIL comprising a hole transport matrix.

Blue OLED comprising B2 coordination complex as a p-dopant in a neat hole injection layer combined with a p-doped hole injection layer.

Example 3

Blue tandem OLED comprising an inverse coordination complex as a neat hole generation layer Table 3a schematically describes the model device.

TABLE 3a

| Material | c [wt %] | d [nm] |
|---|---|---|
| ITO | 100 | 90 |
| F1:PD-2 | 92:8 | 10 |
| F1 | 100 | 145 |
| ABH113:BD200 | 97:3 | 20 |
| F3 | 100 | 26 |
| F4:Li | 99:1 | 10 |
| ZnPc | 100 | 2 |
| p-dopant | 100 | 1 |
| F1 | 100 | 30 |
| ABH113:BD200 | 97:3 | 20 |
| F3 | 100 | 26 |
| F4:Li | 99:1 | 10 |
| Al | 100 | 100 |

The results are given in Table 3b

TABLE 3b

| | U* [V] | EQE* [%] | CIE-y* |
|---|---|---|---|
| 1 nm B2 (reference) | 10.65 | 6.3 | 0.066 |
| 1 nm E3 | 7.52 | 13.5 | 0.083 |

*j = 10 mA/cm$^2$
**j = 30 mA/cm$^2$

The results show that inverse coordination complexes might be suitable as a neat CGL.

Example 4

Blue tandem OLED comprising an inverse coordination complex as a p-dopant in a hole generation layer Table 4a schematically describes the model device.

TABLE 4a

| Material | c [wt %] | d [nm] |
|---|---|---|
| ITO | 100 | 90 |
| F1:PD-2 | 92:8 | 10 |
| F1 | 100 | 145 |
| ABH113:BD200 | 97:3 | 20 |
| F3 | 100 | 25 |
| F4:Li | 99:1 | 10 |
| ZnPc | 100 | 2 |
| F1:p-dopant | 84:16 (mol %)# | 10 |
| F1 | 100 | 30 |
| ABH113:BD200 | 97:3 | 20 |
| F3 | 100 | 26 |
| F4:Li | 99:1 | 10 |
| Al | 100 | 100 | based on molar amount of metal atoms

The results are given in Table 4b

TABLE 4b

|  | U* [V] | EQE* [%] | CIE-y* | U(50 h) − U(1 h)** [V] |
|---|---|---|---|---|
| B2 (reference) | 8.98 | 13.4 | 0.082 |  |
| E3 | 7.75 | 14.2 | 0.087 | 0.094 |

*j = 10 mA/cm$^2$
**j = 30 mA/cm$^2$

The results demonstrate that inverse metal complexes may be useful also in this embodiment of a tandem OLED.

From the foregoing detailed description and examples, it will be evident that modifications and variations can be made to the compositions and methods of the invention without departing from the spirit and scope of the invention. Therefore, it is intended that all modifications made to the invention without departing from the spirit and scope of the invention come within the scope of the appended claims.

The invention claimed is:

1. An organic electronic device comprising at least one inverse coordination complex, the inverse coordination complex comprising:
(i) a core consisting of one atom or of a plurality of atoms forming together a covalent cluster;
(ii) a first coordination sphere consisting of at least four electropositive atoms having each individually an electronegativity according to Allen of less than 2.4; and
(iii) a second coordination sphere comprising a plurality of ligands;
wherein the first coordination sphere is closer to the core than the second coordination sphere;
all atoms of the core have a higher electronegativity according to Allen than any of the electropositive atoms of the first coordination sphere; and
at least one ligand of the second coordination sphere is covalently bound to at least two atoms of the first coordination sphere;
wherein the organic electronic device comprises, between a first electrode and a second electrode, an organic semiconducting layer comprising the at least one inverse coordination complex,
wherein the organic semiconducting layer is a charge injection layer, a charge transport layer, or a charge generation layer, and
wherein the charge injection layer is a hole injection layer, the charge transport layer is a hole transport layer, and/or the charge generation layer is a hole generation layer.

2. The organic electronic device according to claim 1, wherein the electropositive atoms of the first coordination sphere are independently selected from atoms having an electronegativity according to Allen of less than 2.3.

3. The organic electronic device according to claim 1, wherein the electropositive atoms are independently selected from metal ions in the oxidation state (II).

4. The organic electronic device according to claim 1, wherein the core consists of one atom which is O in the oxidation state (-II).

5. The organic electronic device according to claim 1, wherein the first coordination sphere consists of four electropositive atoms having an electronegativity according to Allen of less than 2.4, respectively in the oxidation state (II), and the four electropositive atoms are tetrahedrally coordinated to the core.

6. The organic electronic device according to claim 1, wherein at least one ligand of the second coordination sphere is a bidentate anionic ligand formed by deprotonation of an alpha-gamma tautomerizable protic acid and bridging two electropositive atoms of the first coordination sphere.

7. The organic electronic device according to claim 6, wherein the at least one ligand is a carboxylate anion or is represented by the general formula (I)

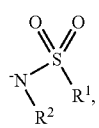

(I)

wherein $R^1$ and $R^2$ are independently selected from the groups, consisting of $C_1$ to $C_{30}$ hydrocarbyl groups and $C_2$ to $C_{30}$ heterocyclic group, wherein $R^1$ and/or $R^2$ may optionally be substituted with at least one of CN, F, Cl, Br and I.

8. The organic electronic device according to claim 7, wherein the core consists of one chalcogen atom selected from O, S, Se and Te in the oxidation state (-II); the first oxidation sphere consists of four electropositive atoms which are four metal atoms in the oxidation state (II) and which are tetrahedrally coordinated to the core, and the second coordination sphere consists of six ligands having the general formula (I).

9. The organic electronic device according to claim 8, wherein each ligand of the second coordination sphere is coordinated to two different metal atoms of the first coordination sphere.

10. The organic electronic device according to claim 9, wherein the organic semiconducting layer further comprises at least one organic matrix compound.

11. The organic electronic device according to claim 1, wherein the organic electronic device is an electroluminescent device.

12. The organic electronic device according to claim 11, wherein the electroluminescent device is an organic light emitting diode.

13. A method for preparing an organic electronic device according to claim 1, the method comprising the steps of
(a) evaporating the inverse coordination complex; and
(b) depositing the inverse coordination complex on a solid support.

* * * * *